US011990879B2

(12) United States Patent
Halbert et al.

(10) Patent No.: US 11,990,879 B2
(45) Date of Patent: May 21, 2024

(54) FULLY-DIFFERENTIAL AMPLIFIER WITH INPUT COMMON-MODE VOLTAGE CONTROL

(71) Applicant: Texas Instruments Incorporated, Dallas, TX (US)

(72) Inventors: Joel Martin Halbert, Tucson, AZ (US); Xiyao Zhang, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 378 days.

(21) Appl. No.: 17/316,775

(22) Filed: May 11, 2021

(65) Prior Publication Data

US 2021/0351752 A1    Nov. 11, 2021

Related U.S. Application Data

(60) Provisional application No. 63/022,743, filed on May 11, 2020.

(51) Int. Cl.
*H03F 3/45* (2006.01)
(52) U.S. Cl.
CPC ... *H03F 3/45475* (2013.01); *H03F 2200/129* (2013.01)

(58) Field of Classification Search
CPC .......................................................... H03F 3/45
USPC .......................................... 330/252, 254, 69
See application file for complete search history.

(56) References Cited

U.S. PATENT DOCUMENTS 7,358,805 B2 * 4/2008 Shia .......................... H03F 1/34
330/69
10,523,166 B2 * 12/2019 Hurwitz .............. H03F 3/45717

* cited by examiner

*Primary Examiner* — Henry Choe
(74) *Attorney, Agent, or Firm* — John R. Pessetto; Frank D. Cimino

(57) ABSTRACT

A fully-differential amplifier (FDA) includes a core differential amplifier and a common-mode input voltage control circuit. The core differential amplifier includes differential inputs. The common-mode input voltage control circuit is coupled to the differential inputs. The common-mode input voltage control circuit is configured to generate an error signal as a difference of an input common mode voltage at the differential inputs and a target common mode input voltage (VICM); and to adjust the input common mode voltage to the VICM based on the error signal.

19 Claims, 7 Drawing Sheets

FULLY-DIFFERENTIAL AMPLIFIER WITH INPUT COMMON-MODE VOLTAGE CONTROL

CROSS-REFERENCE TO RELATED APPLICATION

This application claims priority to U.S. Provisional Application 63/022,743, filed May 11, 2020, titled "Fully Differential Amplifier with Input Common-Mode Voltage Control," which is hereby incorporated by reference in its entirety.

BACKGROUND

Amplifiers are used in a wide variety of applications. An operational amplifier (Op-Amp) is a very familiar and widely used building-block form of amplifier that typically provides very large gain from its difference-sensing input terminals to its single output terminal, so that its input-to-output response becomes essentially the inverse function of a feedback network connected from the single output back to at least one of the differential input terminals. The single-output nature of many amplifiers including standard Op-Amps creates signals commonly termed "single-ended", and leads to certain disadvantages and limitations. These types of amplifiers rely on a common potential node (such as ground) as the reference for the amplifier output. It may become difficult to distinguish between the desired output signal and extraneous signal content introduced from sources other than the primary signal input, such as offsets, coupled noise, interference, long-line transmission effects, ground loops and power-supply variations. Furthermore, the signal voltage amplitude is limited as it is carried as a single-ended signal to the succeeding stages.

Differential-output amplifiers are increasingly used to overcome or minimize the limitations of single-ended signals, and/or in applications that benefit from separation and suppression of common-mode signal content to succeeding stages. A differential-output amplifier generally provides differential or "double-ended" signal output (where the output is determined by the difference between the two outputs as opposed to a difference between a single output and a common potential) in contrast to the more traditional single-ended output of typical amplifiers. Fully-Differential Amplifiers (FDAs) are increasingly known and familiar as the versatile differential-output versions of traditional single-ended Op-Amps, in that they typically provide very large forward-path gain so that the double-ended input-to-output response is essentially set by the inverse of the feedback network transfer function. Although Op-Amps also have differential input terminals that are designed to suppress common-mode signal content, that aspect primarily relates to the Op-Amp's well-known configuration versatility and to the accurate implementation of various single-ended transfer functions. Relating to unwanted signal content from various non-input sources mentioned previously, the single-ended nature of the Op-Amp's output and feedback network make it impossible to distinguish such unwanted signal content, once introduced, from the desired input-sourced signal response. In this respect, it is a key point that the differential output terminals of FDAs allow for fully symmetrical, double-ended configuration throughout the feedback network. This full symmetry, a general feature of many differential-output amplifiers including FDAs, greatly increases the probability that various extraneous signals will contribute equally to both sides of the differential signal path so that their effects are minimized for differential output amplifiers. This preserves the ability of succeeding differential-input stages to reject or suppress the extraneous signal content, A further advantage is that the differential input signal itself, though not considered an extraneous source, may frequently have a common-mode content arising from the necessity to maintain practical or optimized operating bias points in preceding signal sources or signal-processing stages. Such content is typically not necessary or desirable to carry forward into succeeding stages. The differential output of an FDA extends the benefits of common-mode suppression, from all these aforementioned causes, to succeeding stages. Further, the double-ended signal path effectively doubles the useful signal range within the voltage constraints of the given operating power supply, resulting in improved dynamic range and performance of the signal path. Therefore, it is generally beneficial to maximize the usage of fully-differential signals throughout the analog signal path.

SUMMARY

A fully-differential amplifier (FDA) that provides control of both input and output common-mode voltages is disclosed herein. In one example, an FDA includes a core differential amplifier and a common-mode input voltage control circuit. The core differential amplifier includes differential inputs. The common-mode input voltage control circuit includes an error amplifier. The error amplifier includes a first input coupled to at least one of the differential inputs, a second input adapted to be coupled to a target common-mode input voltage (VICM), and an output coupled to the differential inputs.

In another example, an FDA includes a core differential amplifier and a common-mode input voltage control circuit. The core differential amplifier includes differential inputs. The common-mode input voltage control circuit is coupled to the differential inputs. The common-mode input voltage control circuit is configured to 1) generate an error signal as a difference of an input common mode voltage at the differential inputs and the VICM; and 2) adjust the input common mode voltage to the VICM based on the error signal.

In a further example, an FDA includes first differential input, a second differential input, a first operational amplifier (Op-Amp), a second Op-Amp, and an output common-mode voltage control circuit. The first Op-Amp includes an inverting input coupled to the first differential input, and an output. The second Op-Amp includes an inverting input coupled to the second differential input, and an output. The output common-mode voltage control circuit is configured to adjust a common-mode voltage at the first and second differential inputs based on a result of a comparison of a target common-mode output voltage (VOCM) to an output common-mode voltage at the outputs of the first Op-Amp and the second Op-Amp.

BRIEF DESCRIPTION OF THE DRAWINGS

For a detailed description of various examples, reference will now be made to the accompanying drawings in which.

The same reference numbers and reference designators are used in the drawings to designate the same or similar (functionally and/or structurally) features.

DETAILED DESCRIPTION

Figure 1:
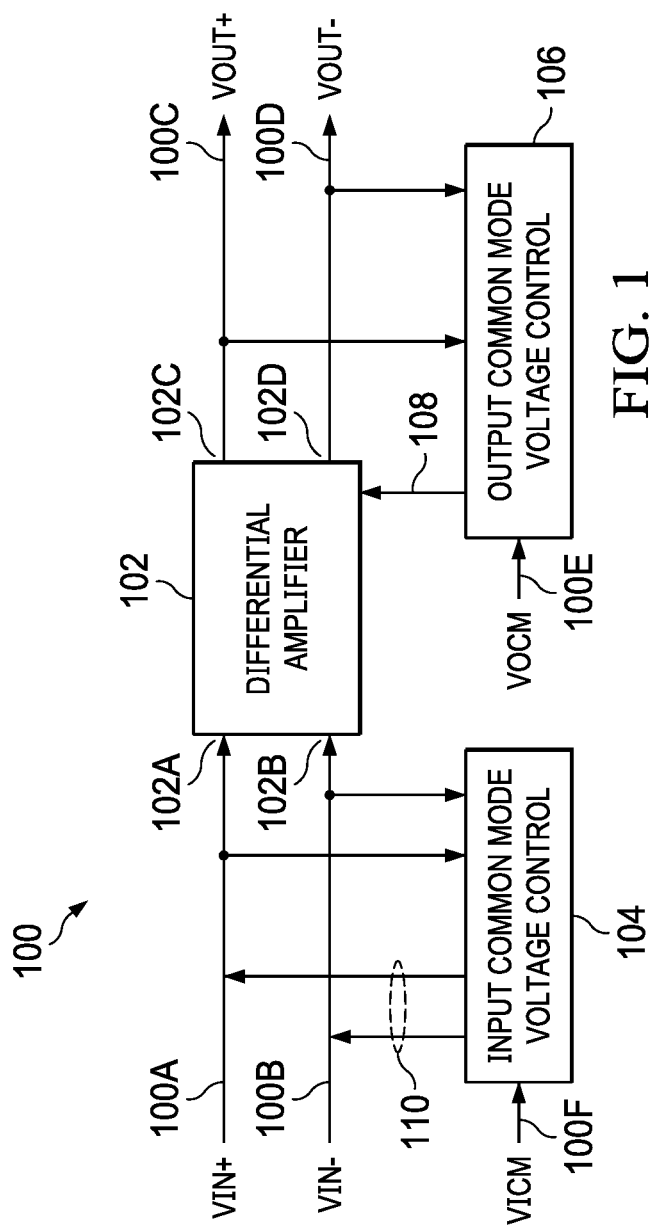
FIG. 1 shows a generalized block diagram for a fully-differential amplifier (FDA) that provides both input and output common-mode voltage control in accordance with various examples.

Modern analog-to-digital convertors (ADCs) often require fully-differential analog signals having a predetermined common-mode voltages at their inputs. To meet such requirements, fully-differential amplifiers (FDAs) may be used to condition the analog voltages before interfacing with the ADC. The advantages of a conventional FDA include suppression of input common-mode signals, suppression of extraneous common-mode noise, interference and signal coupling, suppression of even-order distortions, the ability to set output common-mode voltage to a suitable level for the selected ADC or other driven signal path, and the ability to convert a single-ended input signal to a differential output signal. A notable application limitation of a conventional FDA is that the input-side operating voltage level, at its inverting and non-inverting input or "summing-junction" terminals, is generally not independently controllable. The lack of input-side voltage control is often not problematic if the common-mode voltage and/or current level at the external source inputs to the FDA's gain-setting network result in a common-mode voltage at the FDA summing-junction terminals that is naturally within the FDA's allowable common-mode input range limits. However, if the effect of the common-mode voltage or current level at the external inputs could cause the summing-junction voltage level to be outside the allowable range, then the application circuit and/or the feedback gain network must be modified, or the allowable external input conditions must be restricted to ensure that an out-of-range condition does not occur. Such modification, or operational restriction may be undesirable and may reduce the achievable performance specifications of the overall system.

An example of this situation occurs when the FDA is configured as a differential transimpedance amplifier (TIA), often sourced from photodiodes, in which high-gain differential current-to-voltage conversion is the desired goal, and in which suppression or attenuation of possibly large common-mode input currents is also desired. High differential-mode voltage gain immediately acting on the photodiode currents is desired in order to increase the TIA Signal-to-Noise Ratio (SNR) by increasing signal gain while reducing undesirable noise current. Therefore, in this configuration, the desired high differential TIA gain is achieved directly by employing large resistance values for the positive and negative side feedback resistors that represent the immediate current-to-voltage conversion and gain elements. However, the large feedback resistances act not only to multiply the desired differential input signal, but also act on any common-mode value of input current. In many systems, the unwanted common-mode current level may be both unpredictable and significantly larger than the differential-mode signal level. Therefore, it may not be possible to achieve the desired large differential TIA gain without simultaneously causing large common-mode voltage bias across the two feedback resistors. Such large voltage bias will then directly impact the voltage level of the summing-junction terminals, because the output-side common-mode voltage is already and independently controlled to be a predetermined value suitable for driving an ADC or other signal-processing stage. An undesirable solution to this common-mode vs. differential-mode conflict is to reduce the direct differential TIA gain, that is reduce the feedback resistor values, to a level that accommodates the largest possible common-mode current without exceeding the allowable voltage range at the summing junction terminals. This solution contradicts the goal of high differential-mode gain and requires that further differential-mode gain, if any, be implemented in a succeeding stage (e.g., after the common-mode portion has been eliminated or re-set to an acceptable level). However, further differential-mode gain that is realized in any stage following the direct TIA conversion gain will act both on the differential signal and on the differential-mode noise that was introduced by the undesirably small TIA feedback resistors. The goal of high differential-mode SNR is therefore compromised by the need to limit common-mode gain and keep the summing junction terminals within allowable operating limits.

The situation exemplified by the TIA described above may be generalized to other FDA applications. In general, the need to accommodate the common-mode voltage or current bias level at the external input source terminals in order to avoid exceeding limits on the voltage level at the FDA summing junction terminals, may have an undesirable effect on the design and/or configuration of the differential-mode gain response. In some implementations, an FDA application circuit may introduce a fixed common-mode current or voltage offset to shift the FDA summing-junction terminals into compliance, but only in circumstances where the amount of common-mode correction is predictable and/or not excessively large compared to the differential signal to be amplified. In many situations, the common-mode content is sufficiently large and unpredictable to make such a fixed correction impractical.

Embodiments of the FDAs disclosed herein address the problem of FDA common-mode voltage control by providing independent input and output common-mode voltage controls. The FDAs provide a capability within the FDA for automatic adaptive correction of the common-mode signal content, thereby maintaining the FDA input terminals at least within acceptable limits, or preferably at or near a selected voltage level.

FIG. 1 shows a generalized block diagram for an FDA 100 that provides both input and output common-mode voltage control in accordance with various examples. The FDA 100 includes a differential amplifier 102 (a core differential amplifier), an input common-mode voltage control circuit 104, and an output common-mode voltage control circuit 106. The differential amplifier 102 includes input terminals 102A and 102B to receive a differential input signal, VIN+ and VIN− (collectively, VIN+/−), and output terminals 102C and 102D to drive a differential output signal, VOUT+ and VOUT− (collectively, VOUT+/−).

The output common-mode voltage control circuit 106 is coupled to the output terminals 102C and 102D of the differential amplifier 102. The output common-mode voltage control circuit 106 receives as input: the differential output signal produced by the differential amplifier 102 and a target common-mode output voltage (VOCM). The output common-mode voltage control circuit 106 compares the common-mode voltage on the differential output, VOUT+/−, to VOCM and generates an error signal 108 that is provided to the differential amplifier 102. The error signal 108 indicates an amount of adjustment in the common-mode voltage on VOUT+/− needed to drive the common-mode voltage of VOUT+/− to equal VOCM. The differential amplifier 102 includes circuitry that effectively adjusts the output common-mode voltage on VOUT+/−, based on the error signal 108, such that the common-mode voltage on VOUT+/− substantially equals (or, in some example embodiments, is at least no greater than approximately) VOCM. Thus, the output common-mode voltage control circuit 106 allows the common-mode voltage provided on VOUT+/− to be adjusted as needed to accommodate a circuit or system driven by the FDA 100. Further description of the output common-mode voltage control circuit 106 is provided in FIG. 2.

The input common-mode voltage control circuit 104 is coupled to the input terminals 102A and 102B of the differential amplifier 102. The input common-mode voltage control circuit 104 receives as input the differential input signal present at the input terminals 102A and 102B of the differential amplifier 102 and a target common-mode input voltage (VICM). The input common-mode voltage control circuit 104 compares the common-mode voltage on the differential input, VIN+/−, to VICM and generates an error signal that is provided to drive a common-mode current to the input terminals 102A and 102B of the differential amplifier 102. In some embodiments, the input common-mode voltage control circuit 104 may include circuitry to generate signals 110 that each drive a voltage, based on the error signal generated by the input common-mode voltage control circuit 104, onto resistors (not shown in FIG. 1) that couple to the input terminals 102A and 102B of the differential amplifier 102. The signals 110 may be current or voltage, and may produce a common-mode voltage on VIN+/− that substantially equals VICM. Thus, the input common-mode voltage control circuit 104 allows the common-mode voltage present on VIN+/− to be adjusted as needed. Additional details of the input common-mode voltage control circuit 104 are shown in FIGS. 2-7.

Figure 2:
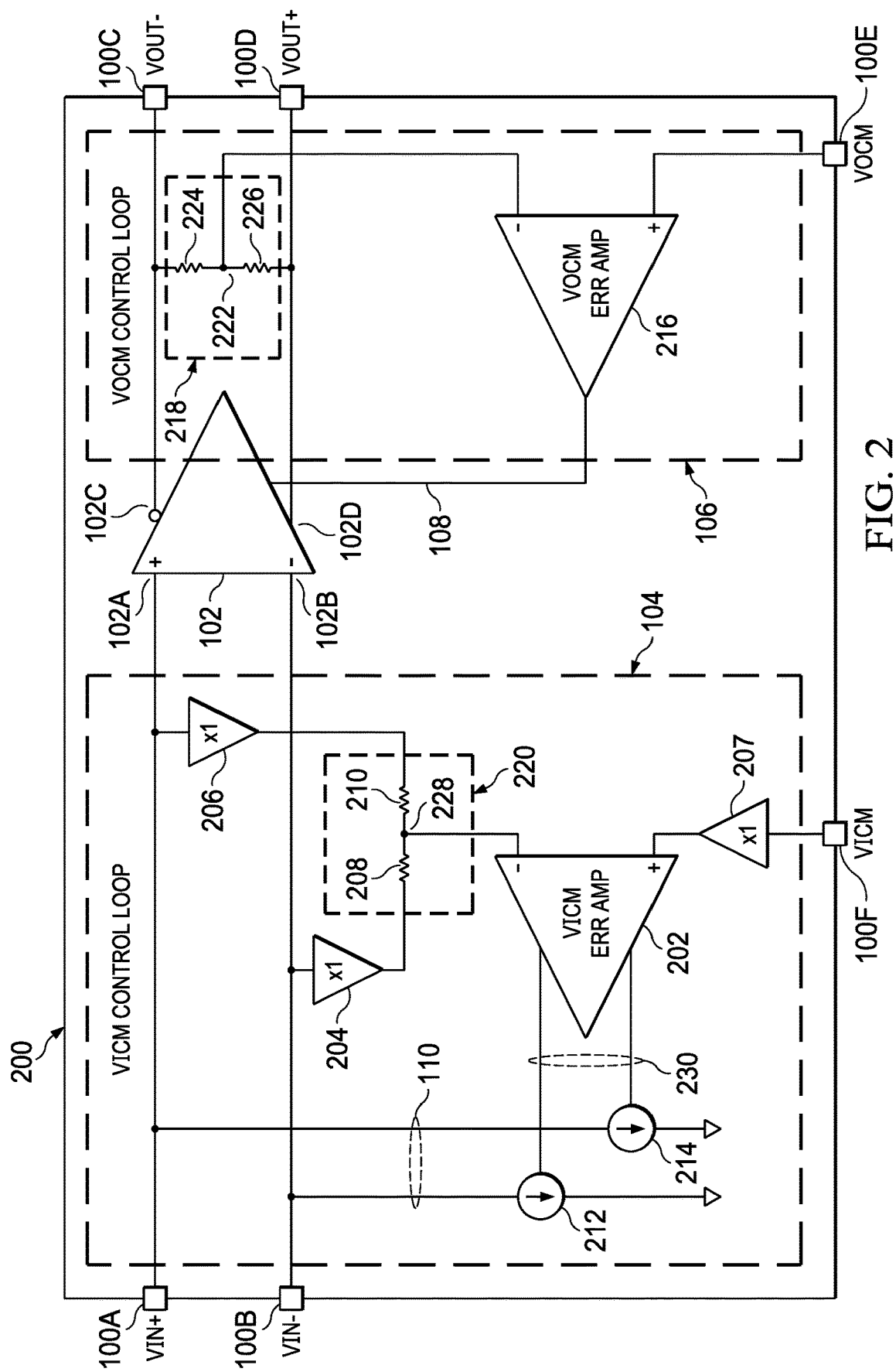
FIG. 2 shows a schematic diagram for an FDA that provides both input and output common-mode voltage control in accordance with various examples.

FIG. 2 shows a schematic diagram for an FDA 200, which is an embodiment of the FDA 100. In the schematic diagram of FIG. 2, additional details of the input common-mode voltage control circuit 104 and the output common-mode voltage control circuit 106 are shown. The output common-mode voltage control circuit 106 includes an averaging network 218 and an error amplifier 216 that form a feedback loop with the differential amplifier 102. The averaging network 218 may include resistors 224 and 226 that are connected in series across the output terminals 102C and 102D of the differential amplifier 102. The value of each of the resistors 224 and 226 may be in a range of 1 kiloohm to 100 kiloohms in some examples of the averaging network 218, and the resistance of the resistor 224 may substantially equal to the resistance of the resistor 226. The average of the voltages driven onto VOUT+/−, that is the common-mode voltage on the output terminals 102C and 102D of the differential amplifier 102 (the output common-mode voltage), is produced at node 222 and provided as an input to the error amplifier 216. The error amplifier 216 generates an error signal 108 representative of the difference of the target output common-mode voltage VOCM and the common-mode voltage on the output terminals 102C and 102D of the differential amplifier 102, and provides the error signal 108 to the differential amplifier 102. VOCM is provided at a VOCM terminal 100E that may be external (such as in example embodiments where the FDA 200 is implemented on a single semiconductor die and terminal 100E designates an external connection) or internal to the FDA 200. The differential amplifier 102 includes output common-mode voltage circuitry that adjusts the output common-mode voltage of the differential amplifier 102 based on the error signal 108.

The input common-mode voltage control circuit 104 includes an averaging network 220, buffer amplifiers 204 and 206 (optional), an error amplifier 202, and current sources 212 and 214 that form a feedback loop. The buffer amplifiers 204 and 206 may be unity gain amplifiers, and are each connected to a different one of the input terminals 102A or 102B of the differential amplifier 102. The purpose of the buffer amplifiers 204 and 206 is to isolate and drive the averaging network 220 and thus preserve high input impedance at the VIN+/− FDA inputs 100A and 100B, respectively. The averaging network 220 may be optional in some implementations of the input common-mode voltage control circuit 104. The inclusion of, and the exact gain and/or level-shifting characteristics of the buffer amplifiers 204 and 206 is not fundamental, and if present their function may be incorporated within the differential amplifier 102. For example, each of the buffer amplifiers 204 and 206 may be implemented as a transistor of a differential pair provided in an input stage of the differential amplifier 102. The outputs of the buffer amplifiers 204, 206 drive the averaging network 220. The averaging network 220 may include resistors 208 and 210 that are connected in series across the outputs of the buffer amplifiers 204 and 206, or may represent the intrinsic output resistance of buffer amplifiers 204 and 206. The effective resistance of each of the resistors 208 and 210 may be in a range of 100 ohms to 5 kiloohms in some embodiments of the averaging network 200, but the range of suitable resistance may be different in other embodiments. The average of the voltages provided on signal VIN+/−, that is the common-mode voltage on the input terminals of the differential amplifier 102, is produced at node 228 and provided as an input to the error amplifier 202. In some implementations of the FDA 200, the node 228 may be formed at the connected emitters (or sources) of a differential pair provided in the input stage of the differential amplifier 102, rather than at a connection of resistors external to the differential amplifier 102.

The input common-mode voltage control circuit 104 may include a buffer 207 coupling the VICM terminal 100F to the error amplifier 202. The VICM terminal 100F may be external or internal to the FDA 200. The gain and level shift characteristics of the buffer 207 substantially match the gain and level-shift characteristics of buffer amplifiers 204 and 206. The error amplifier 202 responds to the difference of the target input common-mode voltage VICM and the common-mode voltage on the input terminals of the differential amplifier 102 to create an error signal 230 that drives current sources 212 and 214. The currents flowing in the current sources 212 and 214 responsive to the error signal 230 produce a common-mode voltage on the input terminals 102A and 102B of the differential amplifier 102 that is substantially equal to VICM. Thus, input common-mode voltage control circuit 104 allows the common-mode voltage present on VIN+/− to be adjusted as needed by changing VICM. In various related embodiments tailored to specific application categories, current sources 212 and 214 may be configured to provide sourcing-current only, sinking-current only or combined sourcing and sinking capability.

While the inclusion of either or both buffer amplifiers 204 and 206, and the averaging network 220, is desirable for symmetry reasons, in practice there is very little difference between the two voltages VIN+ and VIN−, and therefore an embodiment of the FDA 200 may rely on either VIN+ or VIN− alone to substantially determine the input common-mode voltage.

Figure 3:
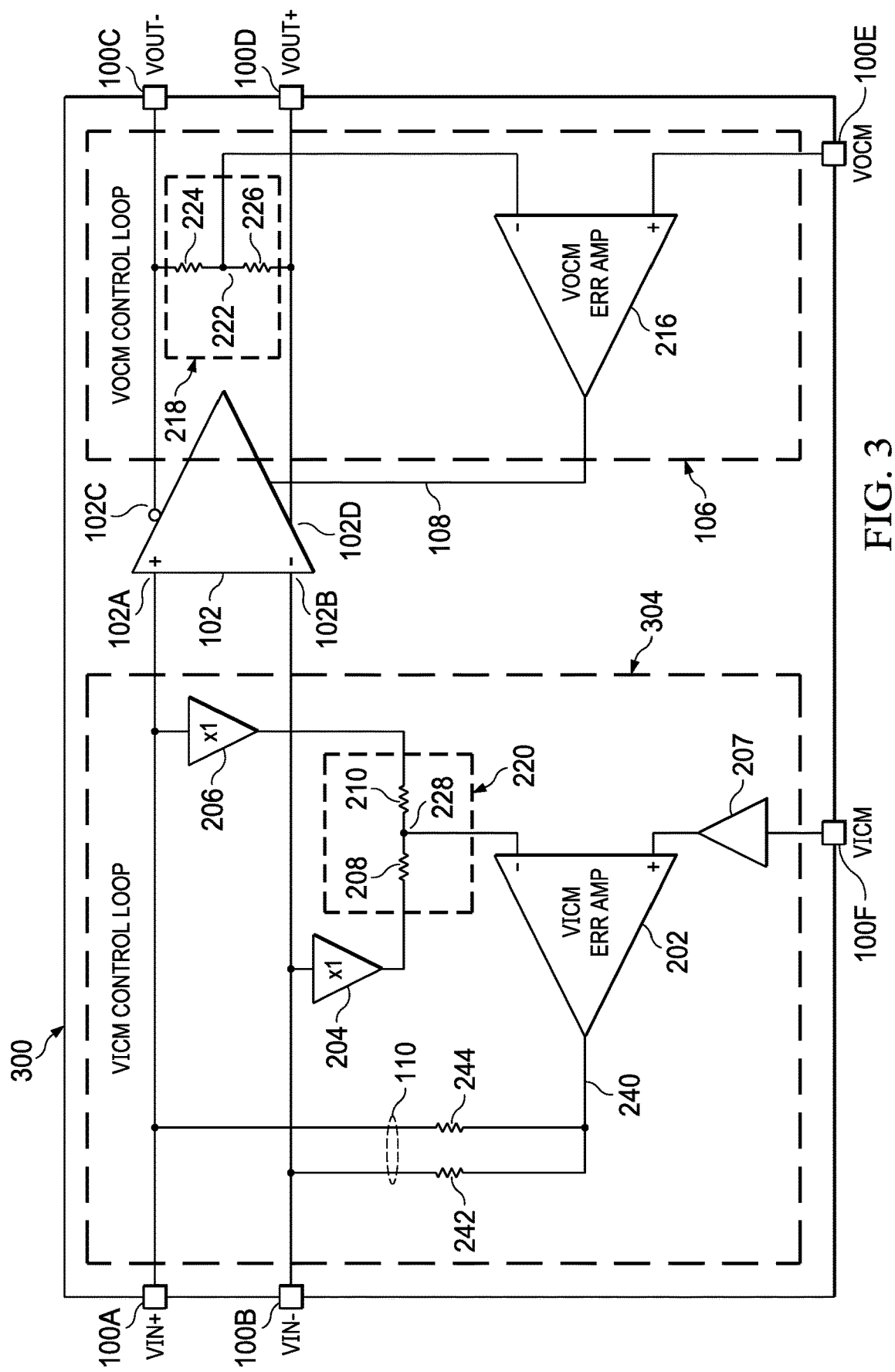
FIG. 3 shows a schematic diagram for an FDA that provides both input and output common-mode voltage control in accordance with various examples.

FIG. 3 shows a schematic diagram for an FDA 300. The FDA 300 is an embodiment of the FDA 100. The FDA 300 includes the differential amplifier 102, the output common-mode voltage control circuit 106, and an input common-mode voltage control circuit 304. In the input common-mode voltage control circuit 304, the error amplifier 202 generates an error signal 240 based on the difference of the target input common-mode voltage VICM and the common-mode voltage on the input terminals of the differential amplifier 102. The error amplifier 202 provides the error signal 240 to resistors 242 and 244 that may be of substantially equal resistance value. The value of the resistors 242 and 244 may be selected based on the common mode current range of the signal VIN+/−, and in various embodiments of the input common-mode voltage control circuit 304 each of the resistors 242 and 244 may have a resistance in a range of 10 kiloohms to 10 megaohms. The resistors 242 and 244 are coupled to the input terminals 102A and 102B of the differential amplifier 102. The currents flowing in the resistors 242 and 244 are responsive to the error signal 240 and produce a common-mode voltage on the input terminals 102A and 102B of the differential amplifier 102 that is substantially equal to VICM. Thus, in the FDA 300, the current sources 212 and 214 of the FDA 100 have been replaced by a voltage driving the resistors 242 and 244, to create common-mode control currents that serve substantially the same function as the current sources 212 and 214 of the FDA 100. It should be noted that the resistors 242 and 244 coupling to the input terminals 102A and 102B will have an effect of modifying the response of external feedback networks such that, while the input-to-output response in the application is substantially unchanged, the loop gain of the modified feedback network may be lower and as a result certain performance parameters such as noise, offset and bandwidth may be affected and may be somewhat degraded in comparison to the FDA 100. It should also be noted that the common-mode correction approach of the FDA 300 may make it more difficult to implement desirable ranging circuitry that could modify the maximum correction range of the common-mode correction currents for various applications while providing the lowest possible current-noise contribution.

Figure 4:
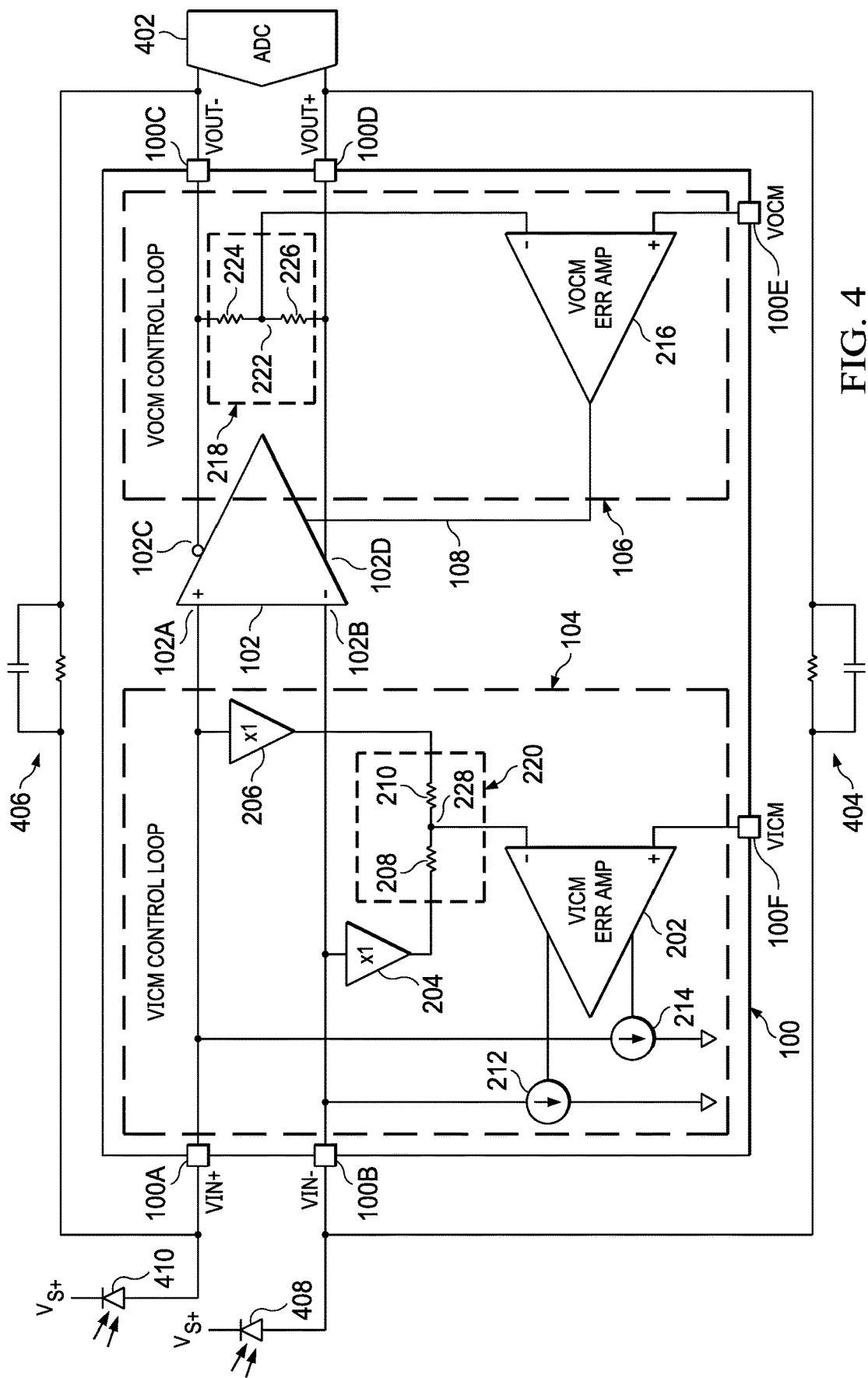
FIG. 4 shows a schematic diagram for an application of an FDA that provides both input and output common-mode voltage control in accordance with various examples.

FIG. 4 shows a schematic diagram for a circuit 400 depicting an application of the FDA 100. As explained above, optimization of the differential-mode gain of a conventional FDA can be problematic when the inputs of the FDA are driven by high impedance current sources such as photodiodes that may have large background photo-current levels. In the circuit 400, photodiodes 408 and 410 are coupled to the differential input terminals 100A and 100B of the FDA 100. Photodiodes 408 and 410 may be external, in some example embodiments, to circuit 400. The differential output terminals 100C and 100D of the FDA 100 are coupled to an ADC 302. In some example embodiments, ADC 302 is implemented external to circuit 400. In the FDA 100, the input common-mode voltage control circuit 104 drives the common-mode voltage on the input terminals 102A and 102B of the differential amplifier 102 to VICM by comparing the common-mode voltage to VICM and controlling the current sources 212 and 214 to source and/or sink common-mode currents from the input terminals 102A and 102B, thereby driving the difference between the common-mode voltage on the input terminals 102A and 102B of the differential amplifier 102 and VICM substantially to zero while retaining the voltage differential between VIN+ and VIN−.

In some embodiments of the input common-mode voltage control circuit 104, the control loop is fast enough to cancel and reject any likely AC as well as DC common-mode components in the input signal of the target application, thereby providing common-mode rejection prior to any current to voltage conversion.

The circuit 400 also includes a feedback network 406 coupled between the inverting output terminal 100C of the FDA 100 and the non-inverting input terminal 100A of the FDA 100, and a feedback network 404 coupled between the non-inverting output terminal 100D of the FDA 100 and the inverting input terminal 100B of the FDA 100. The feedback networks 404 and 406 may be configured to control the voltage and/or current gain of the FDA 100 application circuit. Feedback networks 404 and/or 406 may be integrated internal to device 400 or one or both may be external to device 400.

Figure 5:
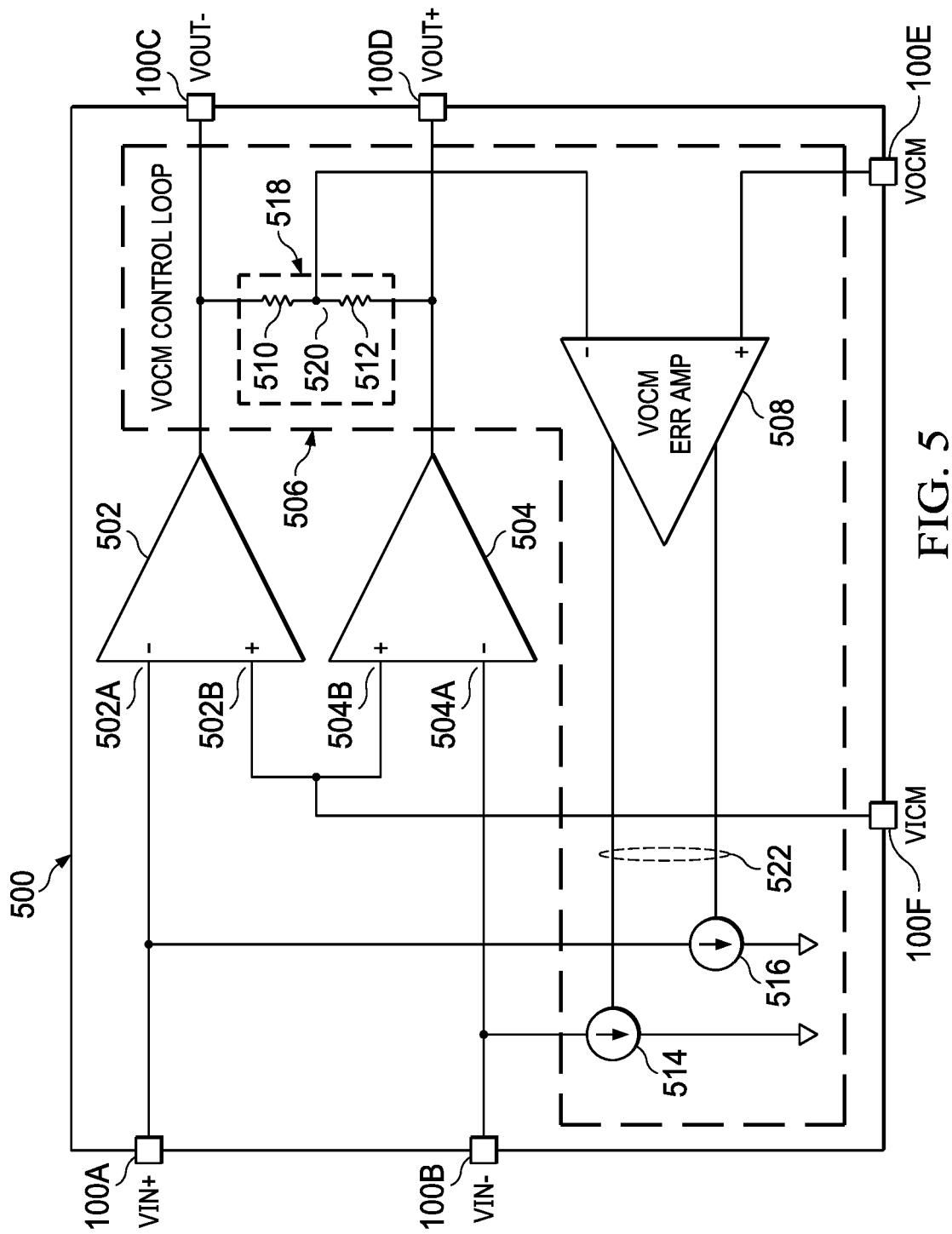
FIG. 5 shows a schematic diagram for an FDA implementation based on two operational amplifiers, that provides both input and output common-mode voltage control in accordance with various examples.

FIG. 5 shows an embodiment of an FDA 500 that provides both input and output common-mode voltage control in accordance with various examples, by employing an alternative method of input common-mode voltage control in which the VICM terminal 100F is coupled as a third common-mode input or set of inputs to the FDA input-stage circuitry, rather than being compared to a derived FDA common-mode input level using a separate error amplifier. FIG. 5 illustrates a schematic diagram of the modified input scheme by representing an FDA 500 as including two operational amplifiers (Op-Amps) 502 and 504, and output common-mode voltage control circuit 506. An inverting input 502A and 504A of the each of the Op-Amps 502 and 504 is connected to a differential input terminal 100A or 100B of the FDA 500. The non-inverting inputs 502B and 504B of the Op-Amps 502 and 504 are connected to the VICM terminal 100F of the FDA 500 to control input common-mode voltage. The Op-Amps 502 and 504 may be separated in the manner of two standard single-ended Op-Amps, or may be coupled together in various ways and/or at various points of their respective signal and bias stages in the manner of typical FDA circuit implementations. In other example embodiments, VICM terminal 100F may be connected to the inverting inputs (502A and 504A) of Op-Amps 502 and 504, respectively, while VIN+ is connected to non-inverting input 502B of Op-Amp 502 and VIN− is connected to non-inverting input 504B of Op-Amp 504.

The output common-mode voltage control circuit 506 includes an averaging network 518, an error amplifier 508, and current sources 514 and 516. The averaging network 518 includes resistors 510 and 512 that are connected in series across the differential output terminals 100C and 100D of the FDA 500. The value of each of the resistors 510 and 512 may be in a range of 1 kiloohm to 100 kiloohms in some examples of the averaging network 518, and the resistance of the resistor 510 may substantially equal to the resistance of the resistor 512. The average of the voltages provided on signals VOUT+/−, that is the common-mode voltage on the differential output terminals 100C and 100D of the FDA 500, is produced at node 520 and provided as an input to the error amplifier 508. The error amplifier 508 is also coupled to the VOCM terminal 100E of the FDA 500. The error amplifier 508 responds to the difference of the target output common-mode voltage VOCM and the output common-mode voltage at the node 520 to create error signal 522 that drives current sources 514 and 516. The currents flowing in the current sources 514 and 516, responsive to the error signal 522, produce a common-mode voltage on the inverting inputs 502A and 504A of the Op-Amps 502 and 504 (and the differential input terminals VIN+ and VIN− of the FDA 500) that is substantially equal to VICM. This generation of common-mode voltage on the inverting inputs 502A and 502B, occurs in the course of driving the common-mode average output of FDA 500 to be substantially equal to the voltage on the VOCM terminal. Thus, the correct input conditions of the Op-Amps 502 and 504 represented in FIG. 5, as well as the overall common-mode and differential input and output conditions of the FDA 500 taken as a whole, are satisfied when the input common-mode voltage level is substantially equal to VICM, and the output common-mode voltage level is substantially equal to VOCM. The FDA 500 thus achieves independent control of both input and output common-mode voltages using a single control loop.

Figure 6:
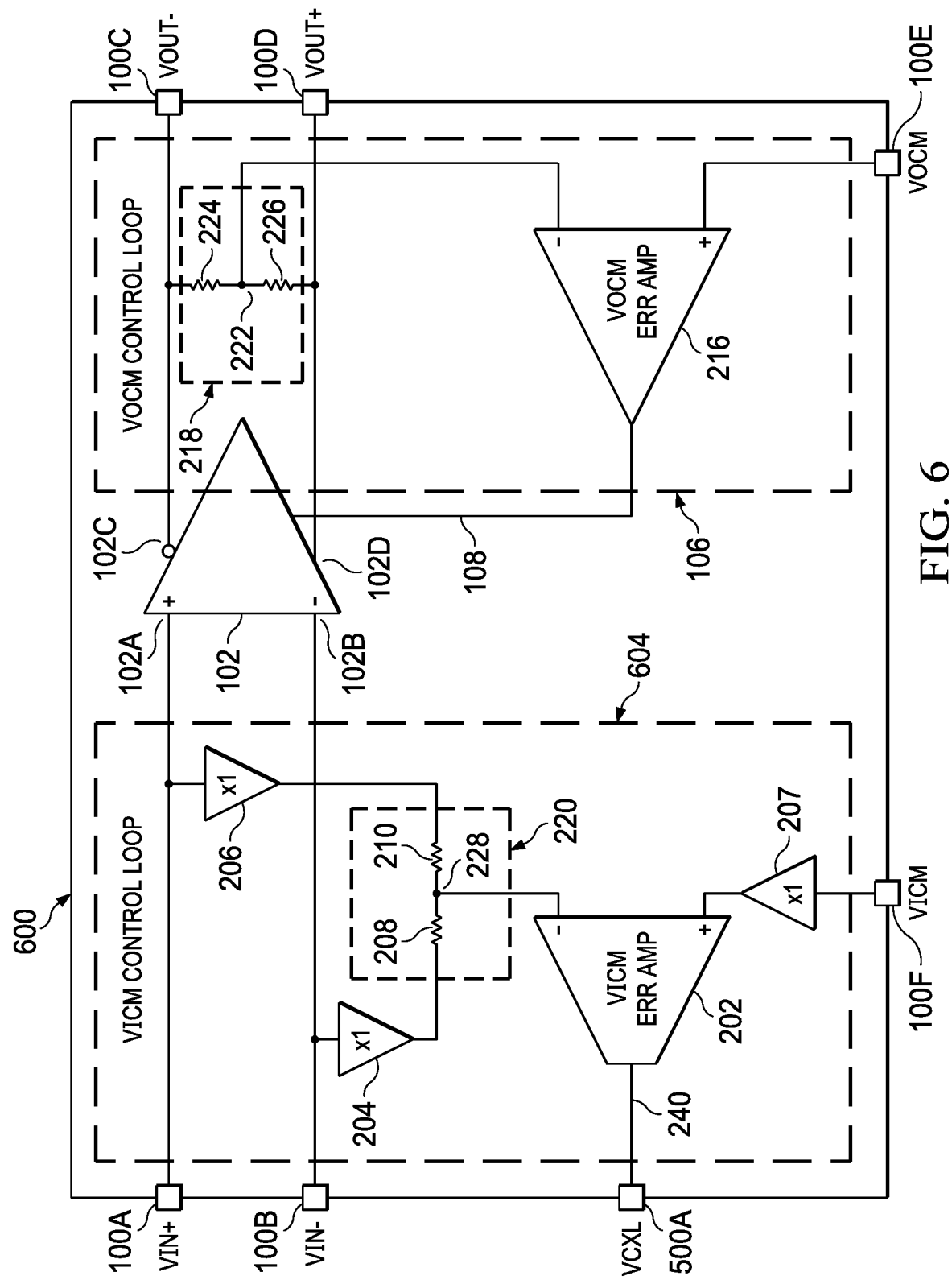
FIG. 6 shows a schematic diagram for an FDA that includes an input common-mode voltage control output in accordance with various examples.

FIG. 6 shows a schematic diagram for an FDA 600 that includes an input common-mode voltage control output in accordance with various examples. The FDA 600 is similar to the FDA 300 illustrated in FIG. 3. However, in the FDA 600 the error signal 240 generated by the error amplifier 202 is provided at a VCXL output terminal 600A of the FDA 600. The FDA 600 includes the differential amplifier 102, an input common-mode voltage control circuit 604, and the output common-mode voltage control circuit 106. The differential amplifier 102 and the output common-mode voltage control circuit 106 operate as described with reference to the FDA 100 and the FDA 300. The input common-mode voltage control circuit 604 is similar to the input common-mode voltage control circuit 304, but includes no feedback to the input terminals 102A and 102B of the differential amplifier 102, instead the error signal 240 generated by the error amplifier 202 is provided to the VCXL output terminal 600A. Current sources or matched resistors may be provided external to the FDA 600 and driven by the VCXL output to effect a common-mode voltage on the input terminals 102A and 102B of the differential amplifier 102 that is substantially equal to VICM. Thus, input common-mode voltage control circuit 604 allows the common-mode voltage present on VIN+/− to be adjusted as needed by changing VICM.

Figure 7:
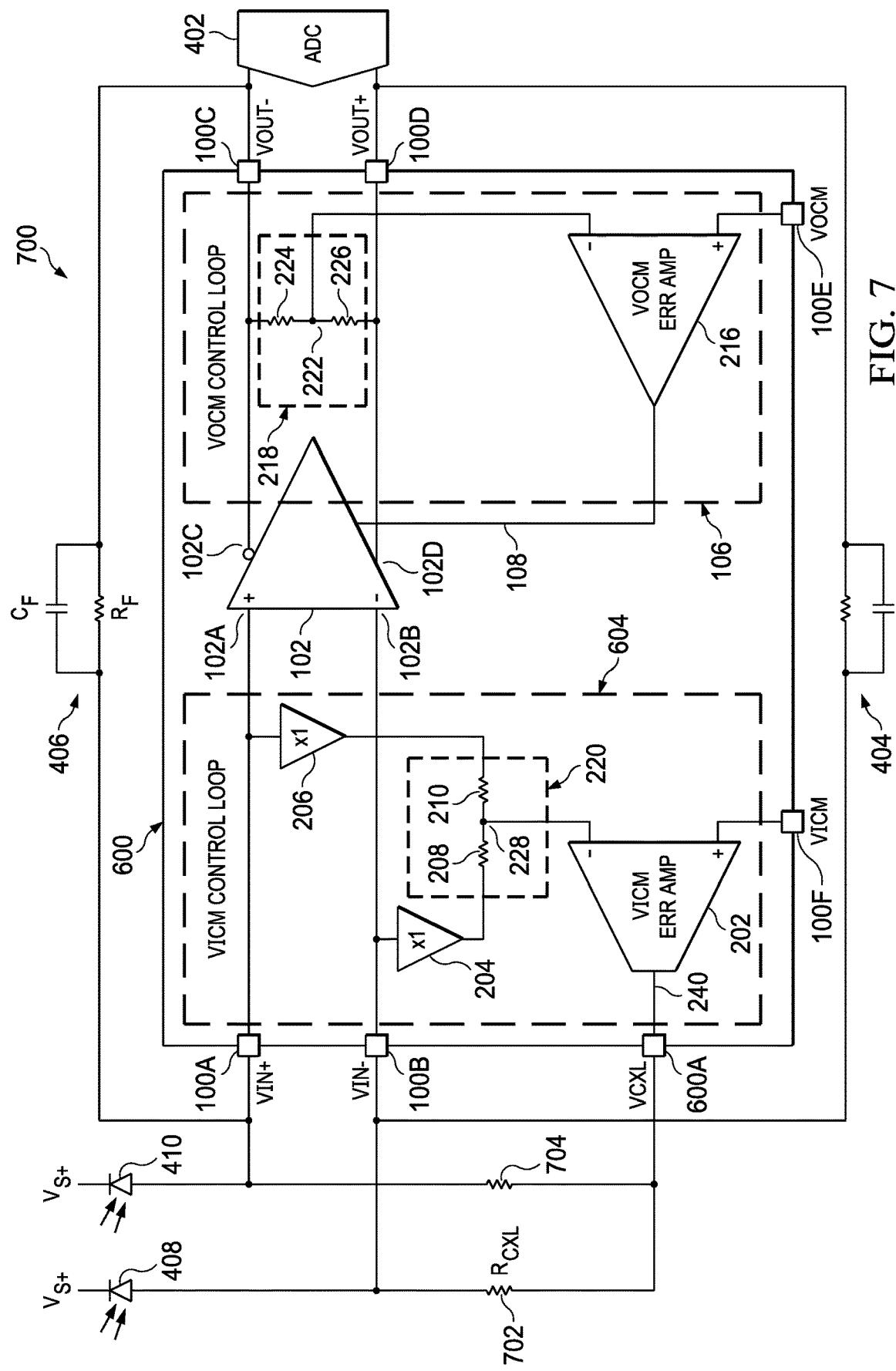
FIG. 7 shows a schematic diagram for an application of an FDA that uses an input common-mode voltage control output in accordance with various examples.

FIG. 7 shows a schematic diagram for a circuit 700 depicting an application of the FDA 600. As explained above, optimization of the differential-mode gain of a conventional FDA can be problematic when the inputs of the FDA are driven by high impedance current sources such as photodiodes that may have large background photo-current levels. In the circuit 700, photodiodes 408 and 410 are coupled to the differential input terminals 100A and 10B of the FDA 600. In the FDA 600, the input common-mode voltage control circuit 604 drives the error signal 240 to the VCXL output terminal 600A. The resistors 702 and 704 are coupled to the VCXL output terminal 600A, and to the differential input terminals 100A and 100B. Via the resistors 702 and 704, the input common-mode voltage control circuit 604 drives currents that cause the common-mode voltage on the differential input terminals 100A and 100B of the FDA 600 to substantially equal VICM. The value of the resistors 702 and 704 may be selected based on the common mode current range of the signal VIN+/−, and in various embodiments each of the resistors 702 and 704 may have a resistance in a range of 10 kiloohms to 10 megaohms.

As used herein, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A.

Also, as used herein, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

While particular transistor structures are referred to herein, other transistors or device structures may be used instead. For example, other types of transistors (such as metal-oxide-silicon, MOSFET) may be utilized in place of bipolar junction transistors. Additionally, the transistors may be implemented as NPN transistors, PNP transistors, pMOSFETs and/or nMOSFETS.

As used herein, the terms "terminal", "node", "interconnection", "lead" and "pin" are used interchangeably. Unless specifically stated to the contrary, these terms are generally used to mean an interconnection between or a terminus of a device element, a circuit element, an integrated circuit, a device or other electronics or semiconductor component.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Unless otherwise stated, "about," "approximately," or "substantially" preceding a value means+/−10 percent of the stated value.

Modifications are possible in the described embodiments, and other embodiments are possible, within the scope of the claims.

What is claimed is:

1. An amplifier comprising:
a differential amplifier including differential inputs; and
a common-mode input voltage control circuit including:
an error amplifier including:
a first input coupled to at least one of the differential inputs;
a second input adapted to be coupled to a target common-mode input voltage (VICM); and
an output coupled to the differential inputs; and
a first buffer amplifier including:
an input coupled to a first of the differential inputs; and
an output coupled to the first input of the error amplifier.

2. The amplifier of claim 1, wherein the first buffer amplifier includes a first transistor of an input stage of the differential amplifier.

3. An amplifier comprising:
a differential amplifier including differential inputs; and
a common-mode input voltage control circuit including:
an error amplifier including:
a first input coupled to at least one of the differential inputs;
a second input adapted to be coupled to a target common-mode input voltage (VICM); and
an output coupled to the differential inputs; and
a first buffer amplifier including:
an input coupled to a first of the differential inputs; and
an output;
a second buffer amplifier including:
an input coupled to a second of the differential inputs; and
an output; and
an averaging network including:
a first terminal coupled to the output of the first buffer amplifier;
a second terminal coupled to the output of the second buffer amplifier; and
a third terminal coupled to the first input of the error amplifier.

4. The amplifier of claim 3, wherein:
the first buffer amplifier includes a first transistor of an input stage of the core differential amplifier; and
the second buffer amplifier includes a second transistor of the input stage of the core differential amplifier.

5. The amplifier of claim 4, wherein the common-mode input voltage control circuit further comprises a third buffer amplifier including:
an output coupled to the second input of the error amplifier; and
an input adapted to be coupled to VICM.

6. The amplifier of claim 1, wherein the common-mode input voltage control circuit further comprises:
a first resistor coupled to the output of the error amplifier and a first of the differential inputs; and
a second resistor coupled to the output of the error amplifier and a second of the differential inputs.

7. The amplifier of claim 1, wherein:
the output of the error amplifier is a first output;
the error amplifier includes a second output; and
the common-mode input voltage control circuit further includes:
a first current source coupled to the first output of the error amplifier and a first of the differential inputs; and
a second current source coupled to the second output of the error amplifier and a second of the differential inputs.

8. The amplifier of claim 1, wherein:
the error amplifier is a first error amplifier;
the differential amplifier includes differential outputs; and
the amplifier further includes:
an output common-mode voltage control circuit coupled to the differential outputs; wherein the output common-mode voltage control circuit includes:
a second error amplifier including:
a first input coupled to the differential outputs;
a second input adapted to be coupled to a target common-mode output voltage (VOCM); and
an output coupled to the differential amplifier.

9. An amplifier comprising:
a differential amplifier including differential inputs;
a common-mode input voltage control circuit coupled to the differential inputs and configured to:
generate an error signal as a difference of an input common mode voltage at the differential inputs and a target common mode input voltage (VICM); and
adjust the input common mode voltage to the VICM based on the error signal;
wherein the common-mode input voltage control circuit includes an error amplifier configured to generate the error signal; and
wherein the common-mode input voltage control circuit includes a first resistor and a second resistor coupled between an output of the error amplifier and the differential inputs.

10. An amplifier comprising:
a differential amplifier including differential inputs;
a common-mode input voltage control circuit coupled to the differential inputs and configured to:
generate an error signal as a difference of an input common mode voltage at the differential inputs and a target common mode input voltage (VICM); and
adjust the input common mode voltage to the VICM based on the error signal;

wherein:
the common-mode input voltage control circuit includes:
a first current source configured to drive a first of the differential inputs based on the error signal; and
a second current source configured to drive a second of the differential inputs based on the error signal.

11. An amplifier comprising:
a differential amplifier including differential inputs;
a common-mode input voltage control circuit coupled to the differential inputs and configured to:
generate an error signal as a difference of an input common mode voltage at the differential inputs and a target common mode input voltage (VICM); and
adjust the input common mode voltage to the VICM based on the error signal;
wherein the common-mode input voltage control circuit includes:
an averaging network configured to generate the input common mode voltage based on voltages at the differential inputs; and
a first buffer amplifier and a second buffer amplifier configured to drive the averaging network based on the voltages at the differential inputs.

12. The amplifier of claim 11, wherein:
the common-mode input voltage control circuit includes a third buffer amplifier configured to apply a gain and level shift to the VICM; and
the gain and level shift of the third buffer amplifier are the same as a gain and level shift of the first buffer amplifier and the second buffer amplifier.

13. The amplifier of claim 9, wherein:
the differential amplifier includes differential outputs;
the error signal is a first error signal; and
the amplifier includes:
an output common-mode voltage control circuit configured to:
generate a second error signal as a difference of an output common-mode voltage at the differential outputs and a target common-mode output voltage (VOCM); and
adjust the output common-mode voltage to the VOCM based on the second error signal.

14. An amplifier comprising:
a first differential input;
a second differential input;
a first operational amplifier (Op-Amp) including:
an inverting input coupled to the first differential input; and
an output;
a second Op-Amp including:
an inverting input coupled to the second differential input; and
an output;
an output common-mode voltage control circuit configured to adjust a common-mode voltage at the first and second differential inputs based on a result of a comparison of a target common-mode output voltage (VOCM) to an output common-mode voltage at the outputs of the first Op-Amp and the second Op-Amp.

15. The amplifier of claim 14, wherein:
the first Op-Amp includes a non-inverting input adapted to be coupled to a target common-mode input voltage (VICM); and
the second Op-Amp includes a non-inverting input adapted to be coupled to the VICM.

16. The amplifier of claim 14, wherein the output common-mode voltage control circuit includes an averaging network coupled to the output of the first Op-Amp and the output of the second Op-Amp, the averaging network configured to produce the output common-mode voltage based on a first voltage at the output of the first Op-Amp and a second voltage at the output of the second Op-Amp.

17. The amplifier of claim 16, wherein the averaging network includes a first resistor and a second resistor coupled in series between the output of the first Op-Amp and the output of the second Op-Amp.

18. The amplifier of claim 14, wherein the output common-mode voltage control circuit includes an error amplifier configured to generate an error signal representing a difference of the VOCM and the output common-mode voltage.

19. The amplifier of claim 18, wherein the output common-mode voltage control circuit includes:
a first current source coupled to the inverting input of the first Op-Amp, and controlled by the error signal; and
a second current source coupled to the inverting input of the second Op-Amp, and controlled by the error signal.

* * * * *